US008709913B2

(12) United States Patent
Oganesian et al.

(10) Patent No.: US 8,709,913 B2
(45) Date of Patent: ＊Apr. 29, 2014

(54) SIMULTANEOUS WAFER BONDING AND INTERCONNECT JOINING

(71) Applicant: Tessera, Inc., San Jose, CA (US)

(72) Inventors: Vage Oganesian, Sunnyvale, CA (US); Belgacem Haba, Saratoga, CA (US); Ilyas Mohammed, Santa Clara, CA (US); Piyush Savalia, San Jose, CA (US); Craig Mitchell, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/939,725

(22) Filed: Jul. 11, 2013

(65) Prior Publication Data
US 2013/0341804 A1   Dec. 26, 2013

Related U.S. Application Data

(63) Continuation of application No. 13/076,969, filed on Mar. 31, 2011, now Pat. No. 8,486,758.

(60) Provisional application No. 61/424,906, filed on Dec. 20, 2010.

(51) Int. Cl.
*H01L 21/30* (2006.01)

(52) U.S. Cl.
USPC ........ 438/455; 438/107; 438/406; 257/E21.5; 257/E21.499

(58) Field of Classification Search
USPC .................. 438/107, 455; 257/777
See application file for complete search history.

(56) References Cited

U.S. PATENT DOCUMENTS

| 4,818,728 A | 4/1989 | Rai et al. |
| 5,726,500 A | 3/1998 | Duboz et al. |
| 5,734,199 A | 3/1998 | Kawakita et al. |
| 6,962,835 B2 | 11/2005 | Tong et al. |
| 8,519,514 B2 * | 8/2013 | Fujii ............................. 257/621 |
| 2002/0113296 A1 | 8/2002 | Cho et al. |

(Continued)

FOREIGN PATENT DOCUMENTS

| JP | 5965457 | 4/1984 |
| JP | 1995050316 | 2/1995 |

(Continued)

OTHER PUBLICATIONS

International Search Report and Written Opinion, PCT/US2011/030871, dated Jun. 24, 2011.

(Continued)

*Primary Examiner* — Jasmine Clark
(74) *Attorney, Agent, or Firm* — Lerner, David, Littenberg, Krumholz & Mentlik, LLP

(57) ABSTRACT

Disclosed are a microelectronic assembly of two elements and a method of forming same. A microelectronic element includes a major surface, and a dielectric layer and at least one bond pad exposed at the major surface. The microelectronic element may contain a plurality of active circuit elements. A first metal layer is deposited overlying the at least one bond pad and the dielectric layer. A second element having a second metal layer deposited thereon is provided, and the first metal layer is joined with the second metal layer. The assembly may be severed along dicing lanes into individual units each including a chip.

20 Claims, 10 Drawing Sheets

(56) References Cited

U.S. PATENT DOCUMENTS

| | | |
|---|---|---|
| 2003/0183945 A1 | 10/2003 | Park |
| 2005/0110131 A1 | 5/2005 | Lee |
| 2005/0110162 A1 | 5/2005 | Meyer-Berg et al. |
| 2006/0121255 A1 | 6/2006 | Nam et al. |
| 2006/0292823 A1 | 12/2006 | Ramanathan et al. |
| 2007/0080441 A1 | 4/2007 | Kirkman et al. |
| 2008/0246136 A1 | 10/2008 | Haba et al. |
| 2010/0246150 A1 | 9/2010 | Wong et al. |
| 2012/0018863 A1 | 1/2012 | Oganesian et al. |
| 2012/0018868 A1 | 1/2012 | Oganesian et al. |

FOREIGN PATENT DOCUMENTS

| | | |
|---|---|---|
| JP | 1999112150 | 4/1999 |
| JP | 20020184811 | 6/2002 |
| JP | 2008098257 A | 4/2008 |
| JP | 20080147220 | 6/2008 |
| JP | 2008153326 A | 7/2008 |
| KR | 20020064824 A | 8/2002 |
| KR | 1006011483 | 7/2006 |
| KR | 20090106828 A | 10/2009 |
| KR | 100945800 B1 | 3/2010 |
| WO | 97/11492 A1 | 3/1997 |

OTHER PUBLICATIONS

Korean Office Action for 10-2011-0032044 dated Apr. 25, 2011.
Taiwan Office Action for Application No. 100147552 dated Oct. 26, 2012.

* cited by examiner

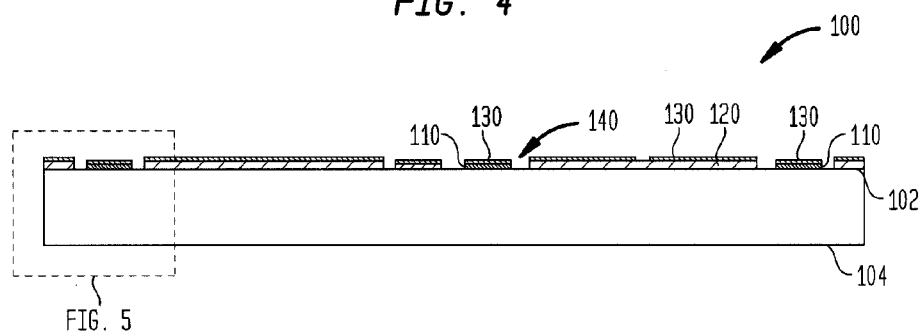
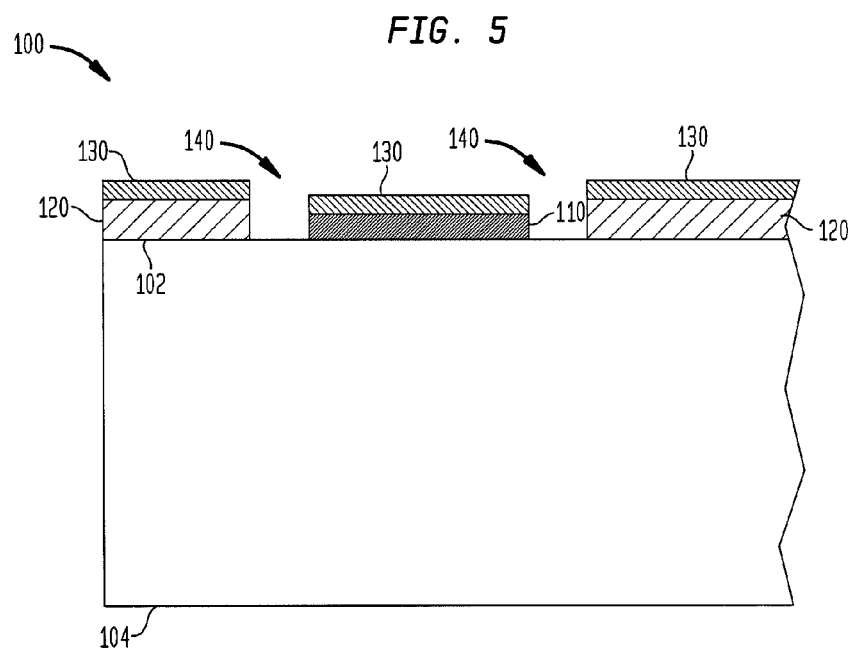

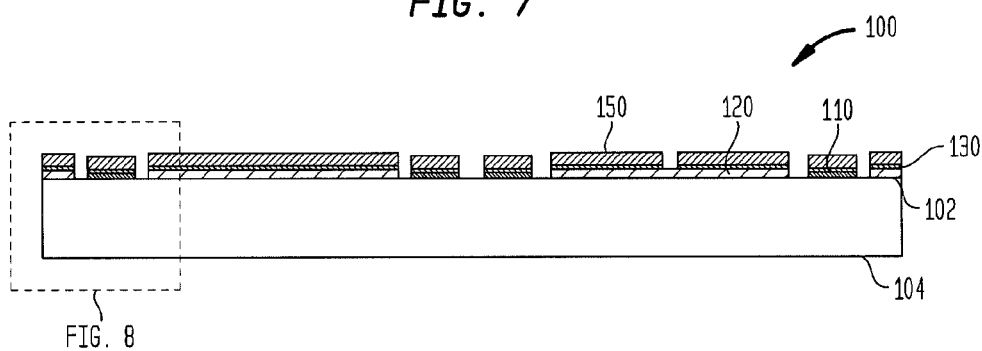
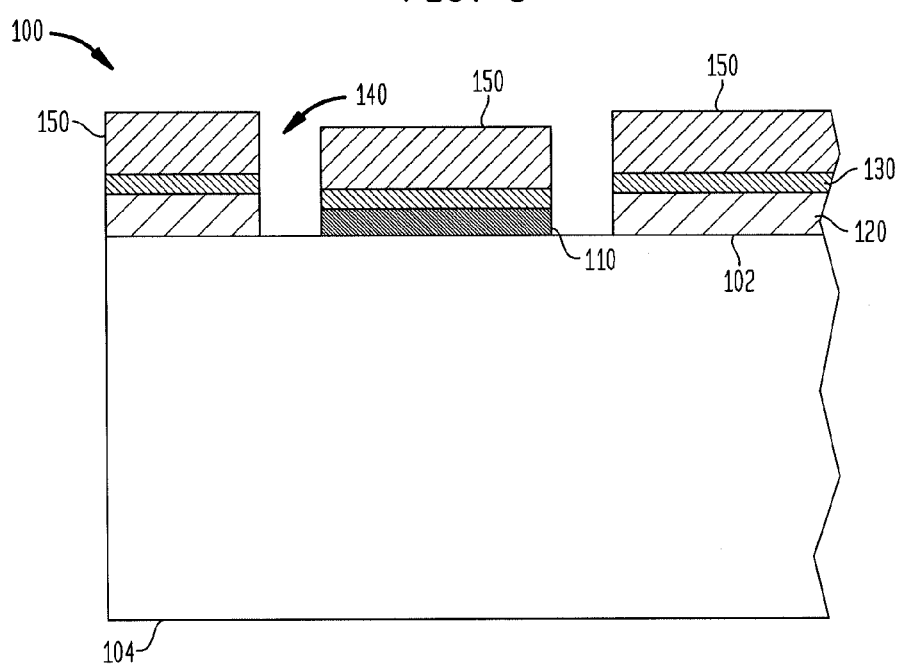

SIMULTANEOUS WAFER BONDING AND INTERCONNECT JOINING

CROSS-REFERENCE TO RELATED APPLICATIONS

The present application is a continuation of U.S. patent application Ser. No. 13/076,969, filed on Mar. 31, 2011, now U.S. Pat. No. 8,486,758, which claims the benefit of the filing date of U.S. Provisional Patent Application No. 61/424,906 filed Dec. 20, 2010, the disclosures of which are hereby incorporated herein by reference.

BACKGROUND OF THE INVENTION

The present invention relates to wafer bonding, and in particular, the bonding of wafers together, which may be accompanied by simultaneously electrically interconnecting such wafers.

Wafer-level packaging techniques can be used in a variety of applications to simultaneously make microelectronic assemblies which include a plurality of microelectronic elements, such as semiconductor chips stacked one over another with electrical interconnections between the chips. In some cases, wafer-level packaging techniques can be used to make microelectronic assemblies which include a microelectronic element having active circuit elements, such as a semiconductor chip, mounted with dielectric or semiconductor element as a packaging layer. Such techniques typically require joining a microelectronic device wafer, i.e., one having active circuit elements, with another element, which can be another device wafer or a packaging layer (e.g., cover wafer or other wafer) having the same size and shape as the device wafer.

One of the challenges of such wafer-level processing is to achieve a sufficiently planar interface between the wafers and to make reliable electrical interconnections between contacts on respective wafers. Further improvements in this respect would be desirable.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

BRIEF SUMMARY OF THE INVENTION

A first aspect of the present invention is a method of forming a microelectronic assembly including the steps of providing a microelectronic element having a major surface, and a dielectric layer and at least one bond pad exposed at the major surface, the microelectronic element containing a plurality of active circuit elements; providing a second element having a coefficient of thermal expansion of less than 10 ppm/° C., the second element having a major surface and a dielectric layer exposed at the major surface; depositing a first metal layer overlying the at least one bond pad and the dielectric layer of the microelectronic element; depositing a second metal layer overlying the dielectric layer of the second element; and joining the first metal layer with the second metal layer.

In accordance with certain embodiments of this first aspect, the steps of depositing may each include depositing a first stage including at least one of copper or aluminum onto at least one of the microelectronic element or the second element. The microelectronic element may be a chip, and the second element may have an area substantially the same as an area of the chip. The step of depositing the first metal layer may include depositing a metal over substantially the entire major surface of the microelectronic element, and the method may further include removing a portion of the metal such that the metal extends to a predetermined height above the major surface of the microelectronic element. The method may further include removing the metal directly overlying the major surface of the microelectronic element at a gap between the at least one bond pad and the dielectric layer. The gap may be large enough to provide a relief volume sufficient to compensate for a sum of the total variation in co-planarity of the top surfaces of the first metal layer overlying the at least one bond pad and the dielectric layer on the microelectronic element, and the total variation in co-planarity of the top surfaces of the second metal layer overlying the dielectric layer on the second element and at least one bond pad exposed at the major surface thereof.

The step of joining may include heating at least one of the first and second metal layers to a temperature between about 50 and 300° C. At least one of the first and second metal layers may include at least a portion which is exothermic and thermally-activated through application of heat, and the step of joining may include heating the at least a portion of the exothermic metal layer to thermally activate such layer. The second element may be a microelectronic element containing a plurality of active circuit elements and may include at least one bond pad exposed at the major surface. At least one of the elements may include a through silicon via electrically connected with the at least one bond pads and extending from the major surface of such element toward a second surface of the element remote from the major surface. A through silicon via may extend through the microelectronic and second elements and may be electrically connected with a bond pad of the microelectronic element and a bond pad of the second element. The step of joining may include juxtaposing the at least one bond pad of the microelectronic element with the at least one bond pad of the second element and heating the first and second metal layers to a joining temperature. The at least one bond pad on each of the elements may include a plurality of bond pads aligned in a plurality of rows. The at least one bond pad on each of the elements may include a plurality of bond pads aligned adjacent a periphery of the respective major surface, and the dielectric layer may overlie a central region of the major surface.

The dielectric layer of at least one of the elements may be compressible to absorb any dimensional tolerances. The height of the at least one bond pad above the major surface of the microelectronic element may differ from the height of the dielectric layer above the major surface of the microelectronic element. At least one of the steps of depositing may include depositing a reflow metal, and the step of joining may include heating the reflow metal to a temperature that causes the reflow metal to melt. The reflow metal may be selected from the group consisting of tin, solder, indium, gold, and any combination thereof. The steps of depositing may include depositing copper, and the step of joining may include applying heat and pressure between the elements such that the copper overlying the microelectronic element and the copper overlying the second element fuse together. The method may further include depositing a layer of gold on the copper overlying at least one of the elements, and the step of joining may include heating the gold to a temperature at which the gold diffuses into the copper. The step of depositing the first and second metal layers may include depositing a base metal and a layer of gold overlying the base metal, and the step of joining may include applying heat and pressure to the elements until the first and second metal layers fuse together.

A second aspect of the present invention is a microelectronic assembly including a microelectronic element having a major surface, and a dielectric layer and at least one bond pad exposed at the major surface, the microelectronic element containing a plurality of active circuit elements; a second element having a coefficient of thermal expansion of less than 10 ppm/° C., the second element having a major surface, and at least one bond pad and a dielectric layer exposed at the major surface thereof; a first metal layer overlying the at least one bond pad and the dielectric layer of the microelectronic element, wherein a gap is formed in the first metal layer between the at least one bond pad and the dielectric layer; a second metal layer overlying the at least one bond pad and the dielectric layer of the second element; and wherein first portions of the first and second metal layers overlying the dielectric layers are joined together and second portions of the first and second metal layers overlying the at least one bond pads and being separate from the first portions are joined together so as to mechanically and electrically connect the microelectronic element with the second element.

In accordance with certain embodiments of this second aspect, the microelectronic element may be a chip, and the second element may be an area substantially the same as an area of the chip. The gap may be large enough to provide a relief volume sufficient to compensate for a sum of the total variation in co-planarity of the top surfaces of the first metal layer overlying the at least one bond pad and the dielectric layer on the microelectronic element, and the total variation in co-planarity of the top surfaces of the second metal layer overlying the at least one bond pad and the dielectric layer on the second element. At least one of the first and second metal layers may include at least a portion which is exothermic and thermally-activated through application of heat.

The second element may be a microelectronic element containing a plurality of active circuit elements. At least one of the elements may include a through silicon via electrically connected with the at least one bond pads and extending from the major surface of such element toward a second surface of the element remote from the major surface. A through silicon via may extend through the microelectronic and second elements and may be electrically connected with a bond pad of the microelectronic element and a bond pad of the second element. The at least one bond pad on each of the elements may include an array of bond pads arranged in a plurality of rows. The at least one bond pad on each of the elements may include a plurality of bond pads arranged adjacent a periphery of such element, and the dielectric layer may overlie a central region of the major surface. A gap may be formed in the second metal layer between the at least one bond pad and the dielectric layer.

The dielectric layer of at least one of the elements may be compressible to absorb any dimensional tolerances. The height of the at least one bond pad above the major surface of the microelectronic element may differ from the height of the dielectric layer above the major surface of the microelectronic element. At least one of the metal layers may include a reflow metal selected from the group consisting of tin, solder, indium, gold, and any combination thereof. Each of the first and second metal layers may include a layer of metal which is wettable by the reflow metal, wherein the reflow metal overlies the wettable metal layer. The first and second metal layers may include copper. The assembly may further include a layer of gold overlying at least one of the first and second metal layers. The first and second metal layers may not directly overly the respective major surfaces of the elements.

A third aspect of the present invention is a microelectronic assembly including a microelectronic element having a major surface and a dielectric layer exposed at the major surface; and a second element having a major surface and a dielectric layer exposed at the major surface; the major surfaces of the first and second wafers confronting one another with a plurality of electrically metal elements disposed between the dielectric layers, the metal elements being electrically isolated from the microelectronic element, wherein the metal elements join the first and second wafers with one another.

In accordance with certain embodiments of this third aspect, the second element has a coefficient of thermal expansion of less than 10 ppm/° C. The microelectronic element may contain a plurality of active circuit elements. The second element may be a microelectronic element containing a plurality of active circuit elements and may include at least one bond pad exposed at the major surface. The microelectronic element may be a chip, and the second element may be an area substantially the same as an area of the chip. On each element, a gap may be formed along the major surface between each metal element and adjacent portion of the dielectric layer, and the gap may be large enough to provide a relief volume sufficient to compensate for a sum of the total variation in co-planarity of top surfaces of the metal elements and the dielectric layer overlying the major surface of the microelectronic element, and the total variation in co-planarity of top surfaces of the metal elements and the dielectric layer overlying the major surface of the second element. The dielectric layer of at least one of the elements may be compressible to absorb any dimensional tolerances.

A fourth aspect of the present invention is a system including a structure as described above and one or more other electronic components electrically connected to the structure. In accordance with certain embodiments of this second aspect, the system may further include a housing, the structure and the other electronic components being mounted to the housing.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

BRIEF DESCRIPTION OF THE DRAWINGS

FIG. 4 is a sectional view of the element shown in FIG. 1 with a thin metal layer disposed thereon.

FIG. 5 is an enlarged view of a portion of the element shown in FIG. 4.

FIG. 7 is a sectional view of the element shown in FIG. 4 with a reflowable metal layer disposed thereon.

FIG. 8 is an enlarged view of a portion of the element shown in FIG. 7.

DETAILED DESCRIPTION

Figure 1:
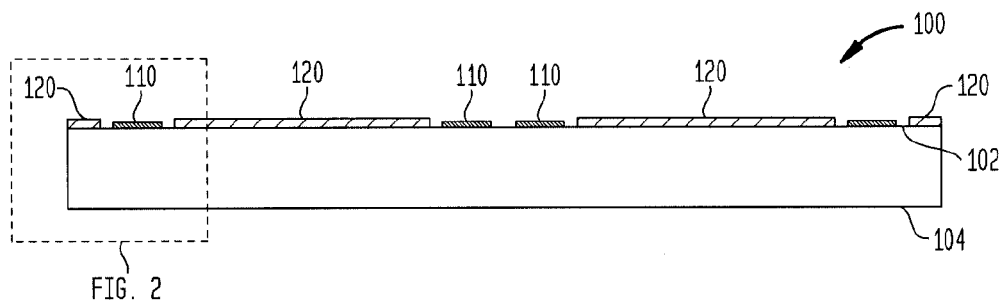
FIG. 1 is a sectional view of a microelectronic element in accordance with a first embodiment of the present invention.
Figure 2:
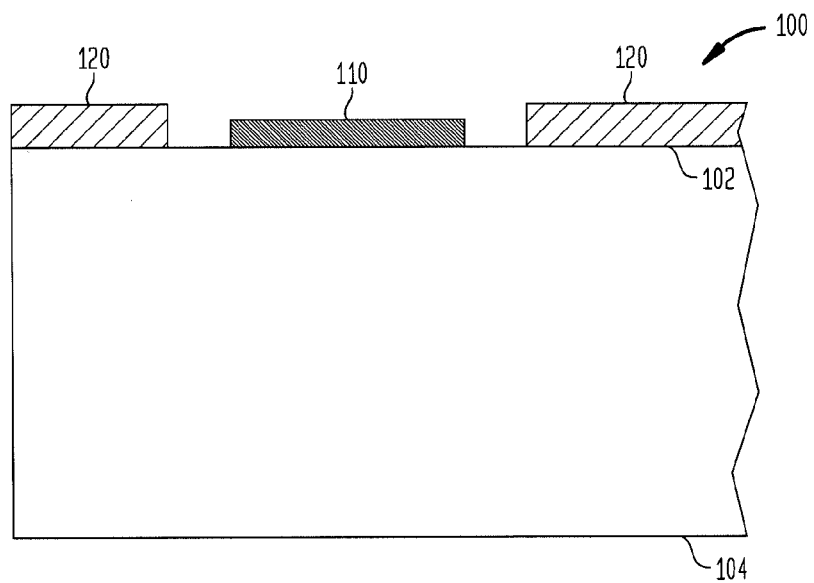
FIG. 2 is an enlarged view of a portion of the element shown in FIG. 1.
Figure 3:
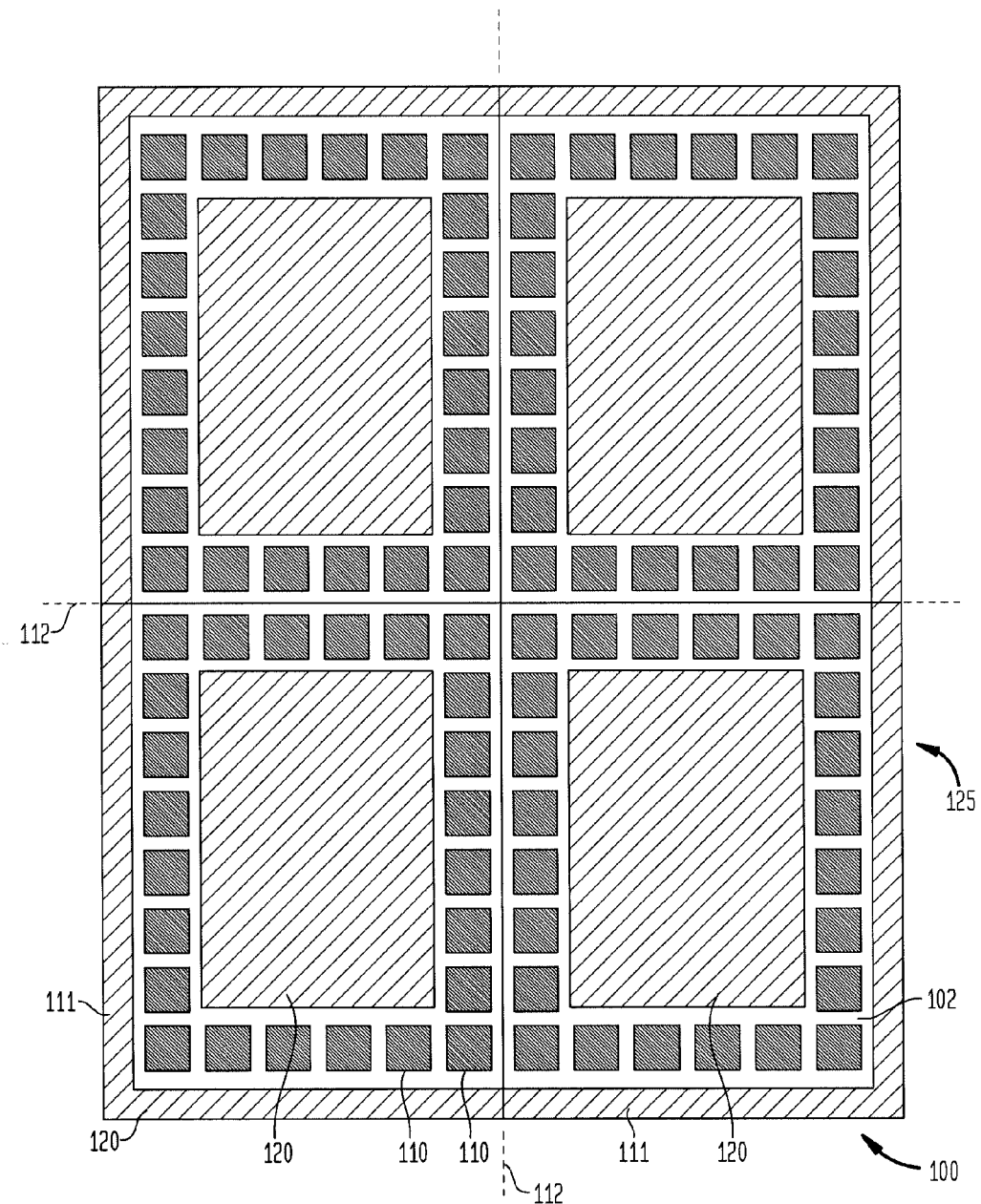
FIG. 3 is a top view of the element shown in FIG. 1.

In accordance with one embodiment of the present invention, FIGS. 1-3 depict a microelectronic element 100, e.g., a device wafer embodying active circuit elements, has a major surface 102 and a second surface 104 remote from major surface 102. A dielectric layer 120 and at least one bond pad 110 are exposed at major surface 102. Dielectric layer 120 is preferably comprised of a material that may be compressible to absorb any dimensional tolerances with regard to bond pads 110 above major surface 102. In certain embodiments, the height of at least one of bond pads 110 above major surface 102 differs from the height of dielectric layer 120 above major surface 102, as shown more clearly in FIG. 2.

Microelectronic element 100 may be a wafer or a semiconductor chip having a plurality of active circuit elements, or a portion of a wafer containing a plurality of semiconductor chips. In another example, microelectronic element 100 may be reconstituted wafer or panel including a plurality of active chips arranged in an array and held together for processing simultaneously. Shown more clearly in FIG. 3 is a portion of a wafer containing four semiconductor chips 111 attached together at dicing lanes 112. Bond pads 110 may be arranged in an array including, for example, being arranged in one or more rows. For example, bond pads 110 may be disposed in rows adjacent the dicing lanes along the periphery 125 of each chip. In certain embodiments, dielectric layer 120 may be disposed within the peripheral bond pads to overlie a central region of major surface 102.

Figure 5A:
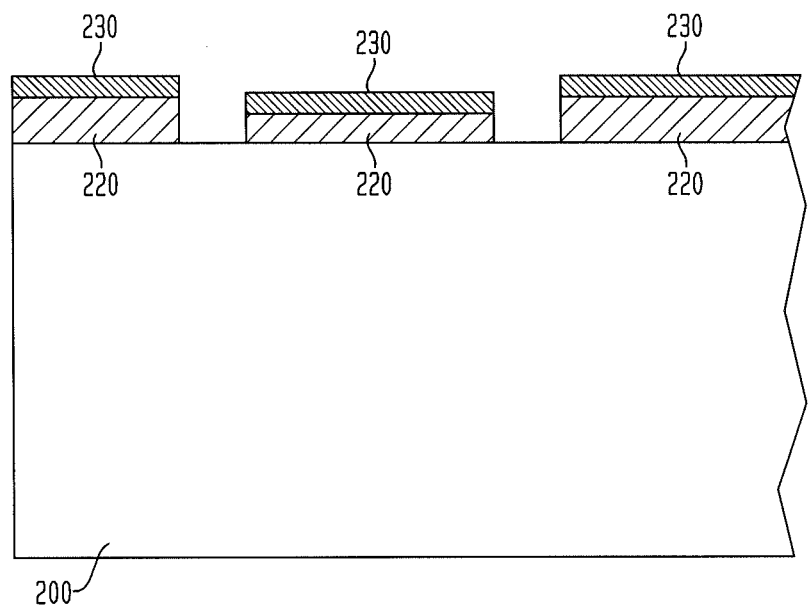
FIG. 5A is a sectional view of a portion of the element shown in FIG. 4A with a thin metal layer disposed thereon.
Figure 6:
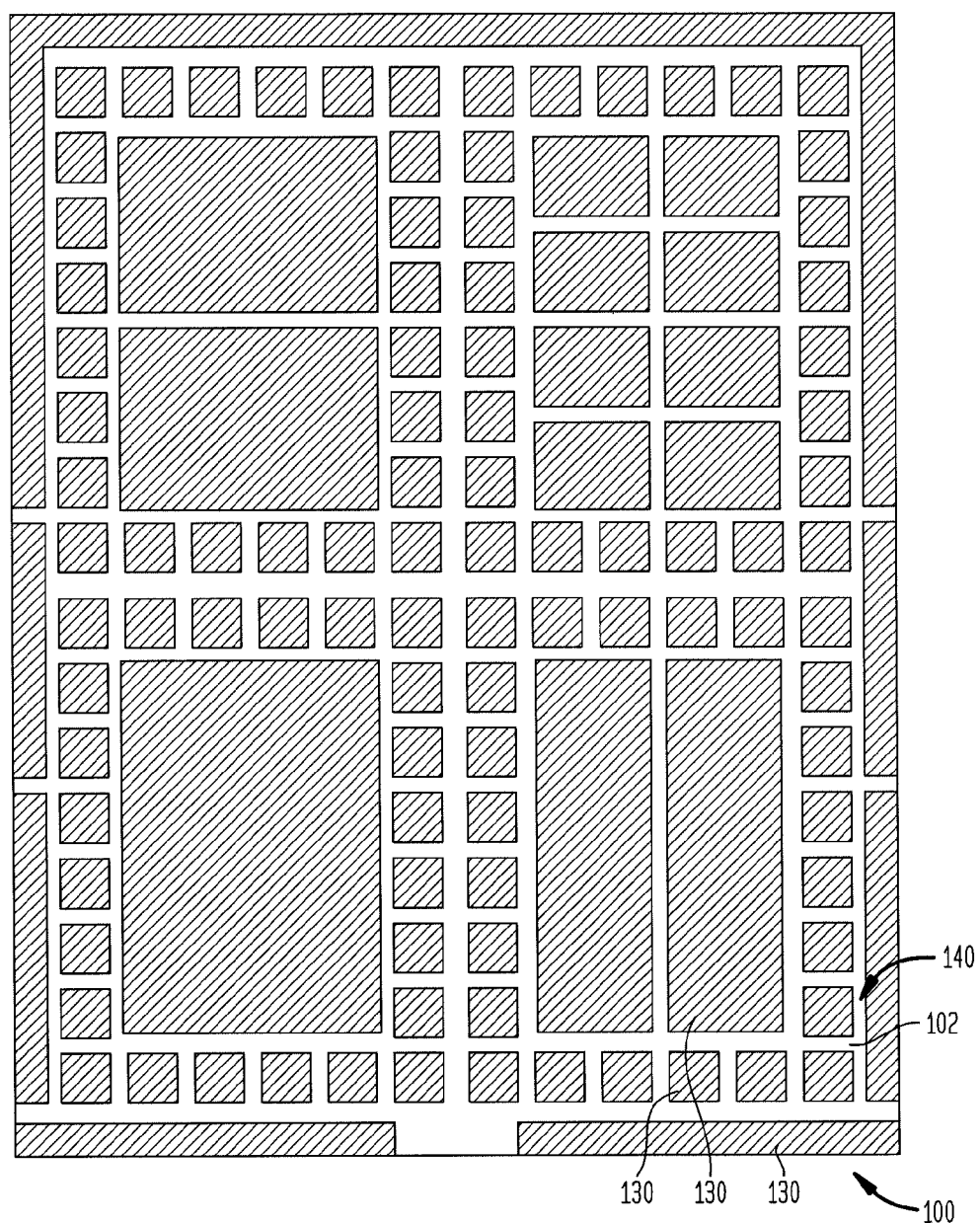
FIG. 6 is a top view of the element shown in FIG. 4.
Figure 9:
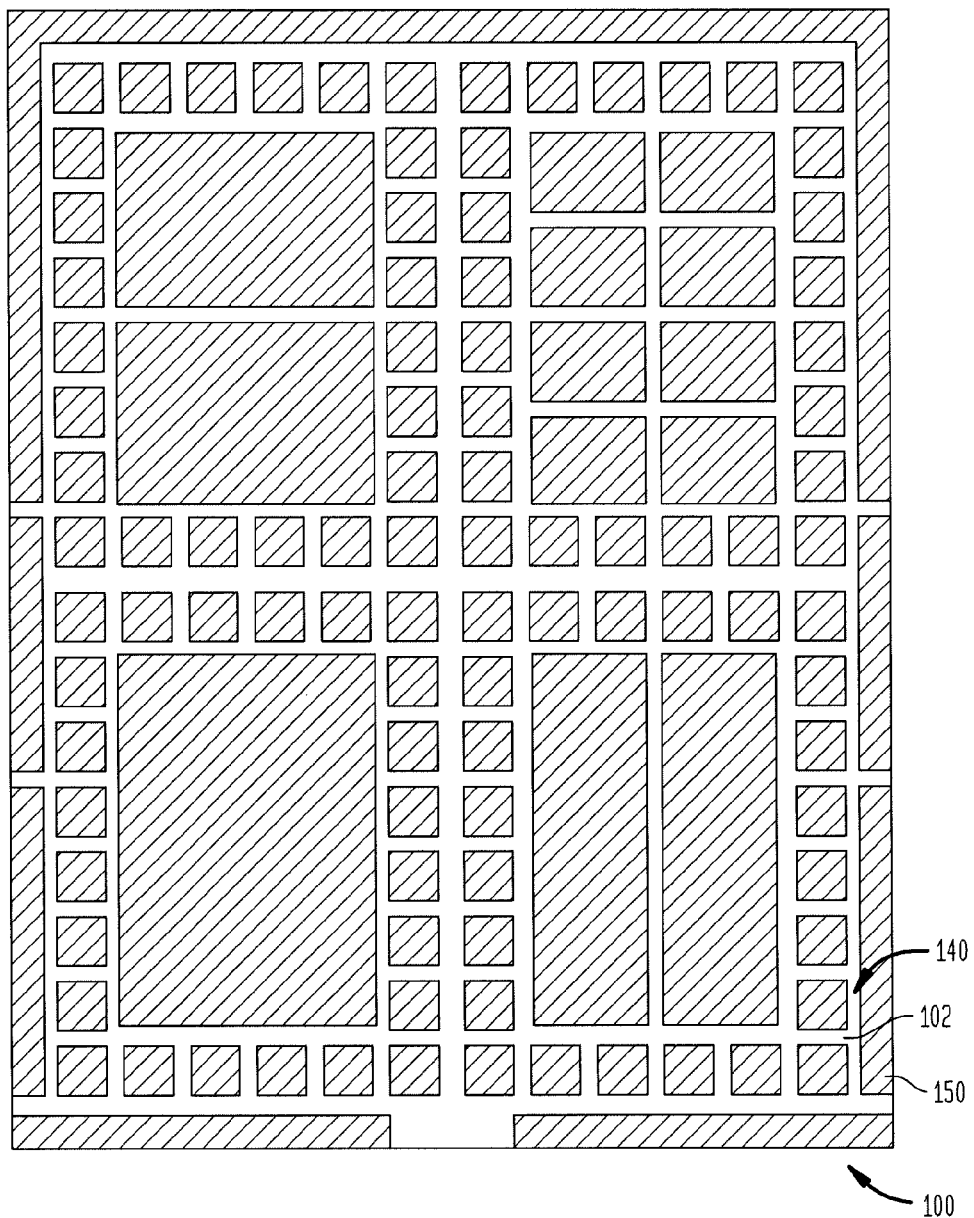
FIG. 9 is a top view of the element shown in FIG. 7.

FIGS. 4-6 depict microelectronic element 100 having a metal layer 130 overlying bond pads 110 and dielectric layer 120. The metal layer 130 can be relatively thin. As shown in FIGS. 7-9, a joining metal such as a reflowable metal layer 150 can be deposited to overlie metal layer 130. When the metal layer 150 is reflowable, it may include tin, solder, indium, gold, or any combination thereof. When the metal layer 150 is a reflowable metal, the underlying metal layer 130 can be wettable by the reflowable metal. In a particular example, the wettable metal layer 130 can include a layer of copper or copper alloy, aluminum or aluminum alloy, or a combination thereof. Such layer or layers can form a base structure of the metal layer 130. Such metal layer 130 may further include a layer of nickel overlying the base structure. In another example, the metal layer 130 may include such layer of nickel, and a layer of gold overlying the nickel layer.

Metal layer 150 may not directly overlie major surface 102, and a gap 140 may exist in metal layer 150 between bond pad 110 and dielectric layer 120. A gap 140 may exist between each adjacent pair of bond pads 110 and dielectric layers 120. Each individual bond pad 110 and dielectric layer can be isolated on major surface 102.

Figure 4A:
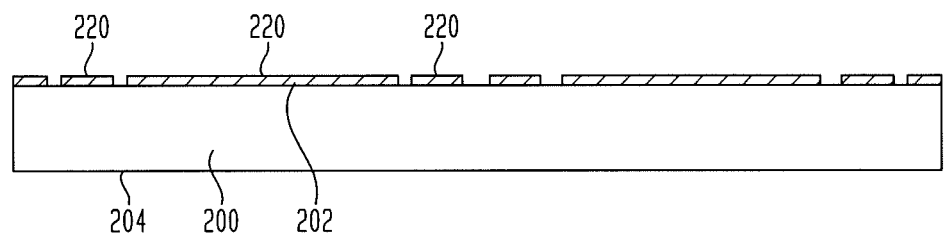
FIG. 4A is a sectional view of an element in accordance with another embodiment of the present invention.
Figure 10:
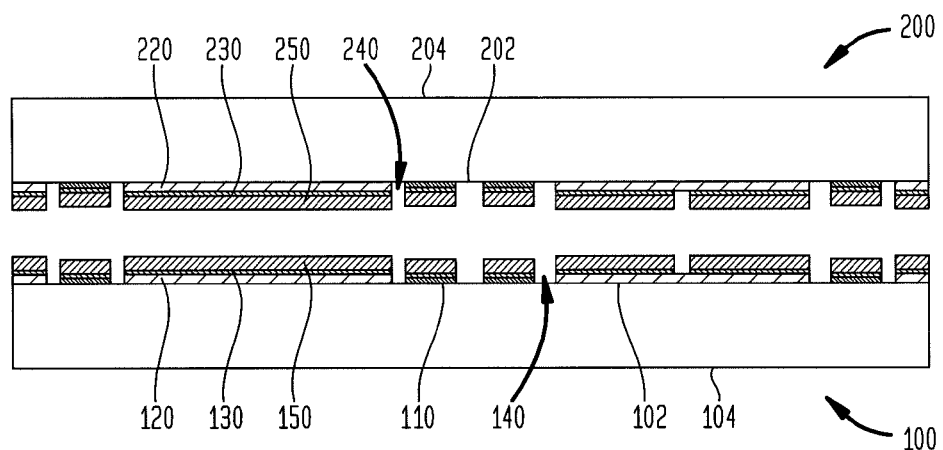
FIGS. 10 and 11 are sectional views of an assembly of two elements in accordance with an embodiment of the present invention.
Figure 11:
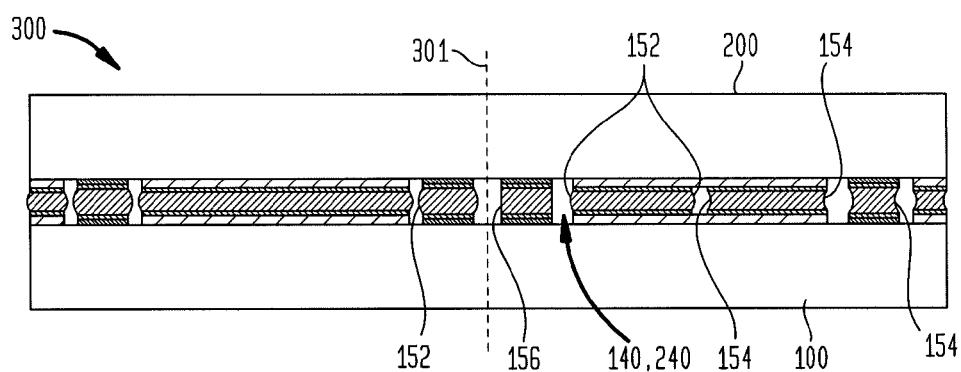

FIGS. 10 and 11 depict microelectronic element 100 being assembled with another element 200, typically to form a wafer-level assembly 300, or other assembly 300 including one or more active chips bonded and electrically interconnected with another active chip or other element. Element 200 may be substantially similar to microelectronic element 100 having active circuit elements, or may be a passive element or wafer having passive circuit elements. Element 200 typically is made of semiconductor material and typically is a semiconductor device wafer embodying active circuit elements, e.g., transistors, diodes, etc. However, in a particular embodiment, element 200 can be a passive or essentially blank semiconductor wafer or other element which can include a base of glass or ceramic material, or other material having a CTE less than 10 ppm/° C. Element 200 may be as shown in FIGS. 4A and 5A, such as an element having a coefficient of thermal expansion of less than 10 ppm/° C. Element 200 has a major surface 202, a second surface 204 remote from major surface 202, and a dielectric layer 220 exposed at major surface 202. In certain embodiments, such as the one depicted in FIGS. 10 and 11, element 200 may be a microelectronic element containing a plurality of active circuit elements and may include at least one bond pad 210. A thin metal layer 230 overlies dielectric layer 220, as shown in FIG. 5A, and also overlies bond pads 210, as shown in FIG. 10. A reflowable metal layer 250 is deposited to overlie metal layer 230. The metal layers 230 and 250 can be as described above for metal layers 130, 150 of the microelectronic element or wafer 100. A gap 240 may exist in metal layer 250 between bond pad 210 and dielectric layer 220, or in the case of a passive element, in between adjacent portions of dielectric layer 220.

In forming assembly 300, elements 100 and 200 are provided with at least element 100 being an active microelectronic element. Metal layers 150 and 250 are deposited over the respective elements. This step may be carried out in different ways. For example, a metal may be deposited over substantially the entire major surface 102, 104 of the respective element 100, 200, covering any bond pads 110, 210 and/or dielectric layers 120, 220 disposed thereon. A portion of the metal may then be removed such that the metal extends to a predetermined height above major surface 102, 104. The metal directly overlying major surface 102, 104 may then be removed at gap 140, 240 between bond pads 110, 210 and dielectric layers 120, 220. Further, each step of depositing the respective metal layer 150, 250 may include depositing a first stage including a metal which can include copper or aluminum, for example.

Prior to joining, bond pads 110 of element 100 are juxtaposed with bond pads 210 of element 200, as shown in FIG. 10. Together, bond pads 110 and 210 may comprise a plurality of electrically isolated metal elements that are eventually disposed on their respective major surfaces 102, 202 between dielectric layers 120, 220. Metal layers 130, 230 above the dielectric material (or the isolated metal elements) may be electrically isolated from internal elements within the respective element 100, 200 or, alternatively, may be usable for connection to a source of power or ground. As shown in FIG. 11, elements 100 and 200 are then joined to one another with metal layer 150 joined to metal layer 250 to form assembly 300, such as by heating the reflow metals to a temperature that causes them to melt and fuse together. In one embodiment, at least one of metal layers 150, 250 is heated to a temperature between about 50 and 300° C. For example, joining of metal layers of solder, tin, indium or gold, or combination thereof, can usually be performed at temperatures below 300° C. At least one of metal layers 150 and 250 may include at least a portion which is exothermic and thermally-activated through application of heat, and the step of joining may include heating the at least a portion of the exothermic metal layer to thermally activate such layer. Any dimensional tolerances are preferably accounted for and absorbed by at least one of dielectric layers 120, 220 being compressible.

Gaps 140 and 240 can be large enough to provide a relief volume sufficient to compensate for a sum of the total variation in co-planarity of the top surfaces of metal layers 150 and 250 overlying the respective bond pads 110 and 210 and dielectric layers 120 and 220. As can be seen in FIG. 11, certain portions of the combined metal layers 150 and 250 may bulge out into gaps 140, 240 as seen at areas 152. Alternatively, portions of such combined metal layers can appear to have concave surfaces adjacent gaps 140, 240 as shown at areas 154. It is also possible that portions of the combined metal layers 150 and 250 have essentially straight and vertical edges as seen at 156. Thus, the joining of elements 100 and 200 is aided by the reflowable metal layers 150 and 250 being able to electrically connect while potentially overflowing into gaps 140, 240 due to any dimensional differentiation related to elements 100 and 200.

In a variation of assembly 300, metal layers 150 and 250 may comprise copper instead of a reflowable metal and one or both metal layers 130, 230 in some cases may be omitted. Joining such layers includes applying heat and pressure between elements 100, 200 such that the copper layers fuse together. A layer of gold may overlie at least one of metal layers 150 and 250, which may be heated to a temperature at which the gold diffuses into the copper at the joining interface between the metal layers 150, 250.

In another embodiment, the step of depositing metal layers 150, 250 includes depositing a base metal and a layer of gold overlying the base metal. Heat and pressure are then applied to the elements until metal layers 150, 250 fuse together.

Figure 12:
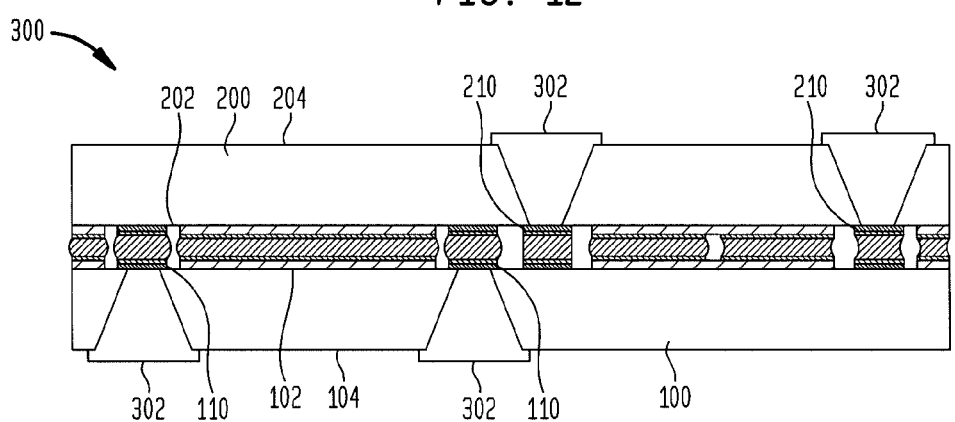
FIGS. 12 and 13 are sectional views of assemblies in accordance with the present invention having through silicon vias.
Figure 13:
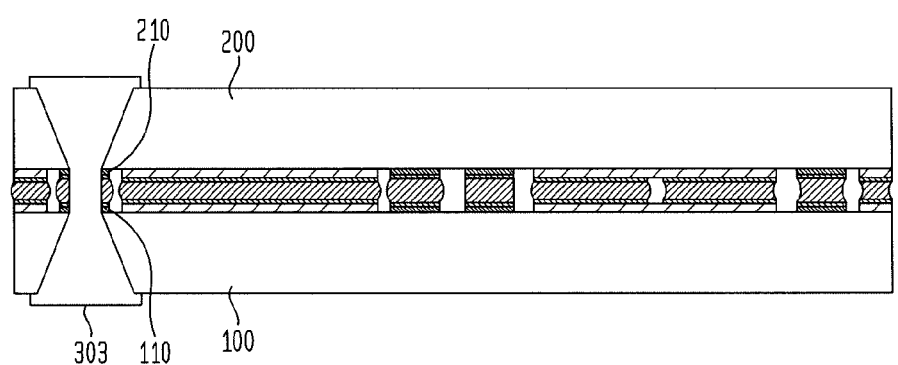

In one embodiment, after bonding elements 100 and 200 together, assembly 300 may be severed along dicing lanes, one such lane being denoted by line 301, into individual microelectronic assemblies or units. Typically, each unit includes an active chip, i.e., a chip embodying active circuit elements, and a corresponding portion of the element 200, which may or may not include another active chip. Assembly 300 may be further constructed as shown in FIG. 12 such that at least one of elements 100 and 200 includes a through via 302 electrically connected with a bond pad and extending through the thickness of such element. For example, a through via 302 extends through element 100 and provides an electrically conductive element therein which is electrically connected to a bond pad 110. Similarly, an electrically conductive through via 302 can extend through element 200 and be electrically connected with bond pad 210. An electrically conductive through via 303 may extend through both elements 100 and 200 and be electrically connected with a bond pad 110 of element 100 and a bond pad 210 of element 200, as shown in FIG. 13.

Various ways of making the electrically conductive through vias exist, which can be as described in U.S. Provisional Application Nos. 61/419,033 and 61/419,037, United States Patent Publication No. 2008/0246136, or U.S. application Ser. Nos. 12/842,717 and 12/842,651, for example, the disclosures of which are incorporated herein by reference.

Figure 14:
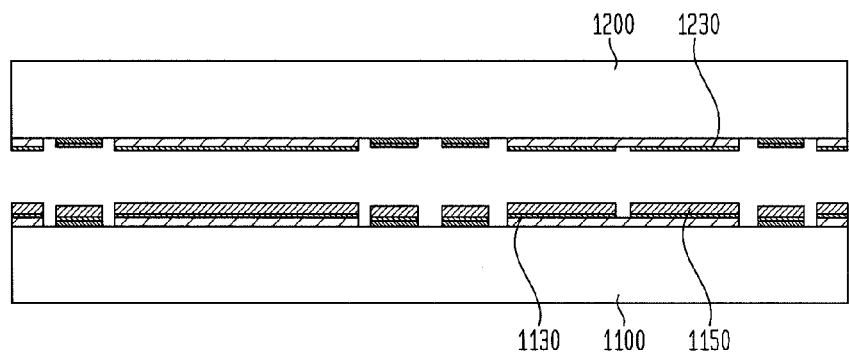
FIG. 14 is a sectional view of an assembly of two elements in accordance with another embodiment of the present invention.

In certain embodiments, only one of metal layers 150, 250 is present prior to joining elements 100 and 200. This construction is shown in FIG. 14, where element 1100 includes metal layer 1150 overlying metal layer 1130, and element 1200 includes as its top layer only metal layer 1230, with no other metal layer overlying same.

Figure 15:
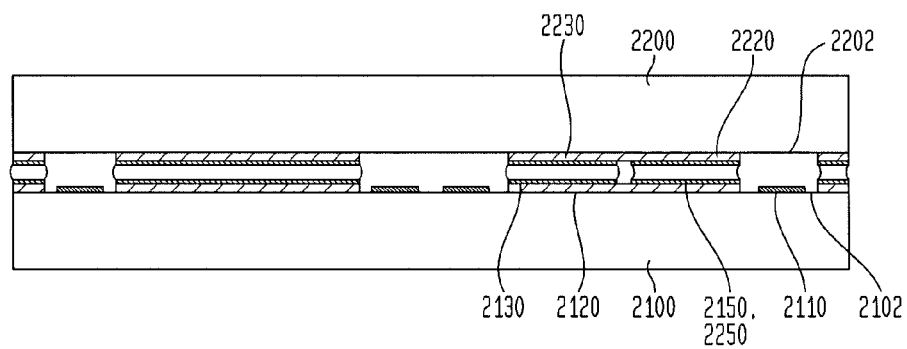
FIG. 15 is a sectional view of an assembly of two elements in accordance with another embodiment of the present invention.

In another embodiment, shown in FIG. 15, an element 2200 can be an interposer, cover wafer or blank wafer, which has no exposed bond pads. Elements 2100, 2200 each include a dielectric layer 2120, 2220, respectively, and a metal layer 2130, 2230 overlying dielectric layers 2120, 2220, respectively. Bond pads 2110 overlying major surface 2102 of element 2100 are adjacent an exposed portion of major surface 2202 of element 2200. Metal layers 2130, 2230, which may only overlie dielectric layers 2120, 2220 and not bond pads 2110, can be electrically interconnected through the joined reflowable metal layers 2150, 2250.

By the foregoing processing, it is possible for the metal layers 130 (FIG. 11), or metal layers 2130 (FIG. 15) on respective wafers or elements to be electrically isolated from one another, and from the wafer or element on which they are provided both before and after bonding the wafers or elements together. Alternatively, some or all of the metal layers 130 or 230 on a wafer or element can be usable for connection to a source of power or ground. For example, a metal layer 130 or 230 on a wafer can extend onto or be electrically connected with ground bond pads of the same wafer which provide ground connections to the chips of such wafer. In still another example, the metal layer 130, or 230 on a wafer can extend onto or be electrically connected with power bond pads of the same wafer which provide power source connections to the chips of such wafer. In yet another example, some portions of the metal layers 130, 230 of each microelectronic assembly can extend onto or be electrically connected with ground bond pads, and other portions of the metal layers 130, 230 of each microelectronic assembly can extend onto or be electrically connected with power bond pads. In these cases, the metal layer of each chip of both wafers, e.g., metal layers 130, 230, and the reflowable metal 150 (FIG. 11) between them in each assembly would be available for connection to a ground terminal or to a power terminal of a microelectronic assembly in which the chips are incorporated.

By the processing described in the foregoing in accordance with one or more of the above-described embodiments, the techniques provided herein typically can compensate for nonplanarity in bonding interface. In one example, the joining or reflowable metal layers 150, 250 can have a thickness of 1 micron on the metal layers 130, 230 and the bond pads 110, 210 of the respective wafers. In such embodiment, the nominal joined thickness of the metal layer 150 (e.g., FIG. 11) is 2 microns. The techniques provided herein can compensate for a total variation in the planarity of the bonding interface across the entire dimensions of the wafers to an extent greater than 0.5 microns. In another example, when the joining or reflowable metal layers 150, 250 have appropriate thicknesses, the techniques herein can compensate for even greater nonplanarity, such as 3 microns.

Figure 16:
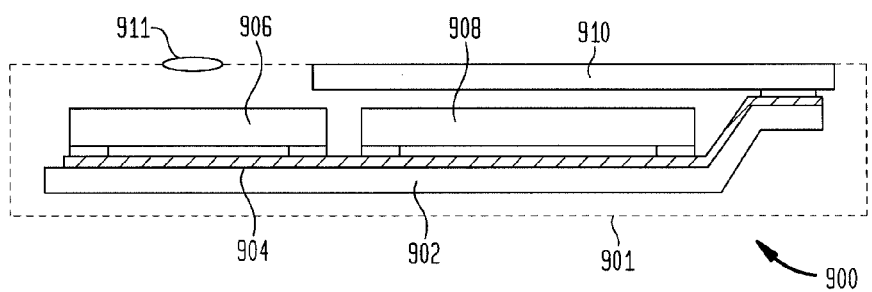
FIG. 16 is a schematic depiction of a system according to one embodiment of the invention.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 900 in accordance with a further embodiment of the invention includes a structure 906 as described above in conjunction with other electronic components 908 and 910. In the example depicted, component 908 is a semiconductor chip whereas component 910 is a display screen, but any other components can be used. Of course, although only two additional components are depicted in FIG. 16 for clarity of illustration, the system may include any number of such components. The structure 906 as described above may be, for example, a composite chip as discussed above or a structure incorporating plural chips. In a further variant, both may be provided, and any number of such structures may be used. Structure 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit board, and the circuit panel includes numerous conductors 904, of which only one is depicted in FIG. 16, interconnecting the components with one another. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Where structure 908 includes a light-sensitive element such as an imaging chip, a lens 911 or other optical device also may be provided for routing light to the structure. Again, the simplified system shown in FIG. 16 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of embodiments should be taken by way of illustration rather than by way of limitation of the invention.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a microelectronic assembly comprising the steps of:

providing a microelectronic element having a major surface, and a dielectric layer and at least one bond pad exposed at the major surface, the microelectronic element containing a plurality of active circuit elements, wherein a height of the at least one bond pad above the major surface differs from a height of the dielectric layer above the major surface, the dielectric layer of at least one of the elements being compressible to absorb any dimensional tolerances;

providing a second element having a coefficient of thermal expansion of less than 10 ppm/° C., the second element having a major surface and a dielectric layer exposed at the major surface of the second element;

forming a first metal layer such that a first portion of the first metal layer overlies the at least one bond pad and a second portion of the first metal layer overlies the dielectric layer of the microelectronic element;

forming a second metal layer overlying the dielectric layer of the second element; and joining the first metal layer with the second metal layer.

2. The method of claim 1, wherein the step of joining includes juxtaposing the at least one bond pad of the microelectronic element with at least one bond pad exposed at the major surface of the second element, thereby simultaneously bonding the microelectronic and second elements and electrically interconnecting the juxtaposed bond pads.

3. The method of claim 1, wherein the steps of forming each include depositing a first stage including at least one of copper or aluminum onto at least one of the microelectronic element or the second element.

4. The method of claim 1, wherein the step of forming the first metal layer includes forming a metal over substantially the entire major surface of the microelectronic element, and further comprising the step of removing a portion of the metal such that the metal extends to a predetermined height above the major surface of the microelectronic element.

5. The method of claim 4, further comprising removing the metal directly overlying the major surface of the microelectronic element at a gap between the at least one bond pad thereof and the dielectric layer thereof.

6. The method of claim 5, wherein the gap is large enough to provide a relief volume sufficient to compensate for a sum of the total variation in co-planarity of top surfaces of the first metal layer overlying the at least one bond pad and the dielectric layer on the microelectronic element, and the total variation in co-planarity of top surfaces of the second metal layer overlying the dielectric layer on the second element and at least one bond pad exposed at the major surface thereof.

7. The method of claim 1, wherein the step of joining includes heating at least one of the first and second metal layers to a temperature between about 50 and 300° C.

8. The method of claim 1, wherein at least one of the first and second metal layers includes at least a portion which is exothermic and thermally-activated through application of heat, and the step of joining includes heating the at least a portion of the exothermic metal layer to thermally activate such layer.

9. The method of claim 1, wherein the second element includes at least one bond pad exposed at the major surface thereof, and wherein at least one of the elements includes a through silicon via electrically connected with the at least one bond pads of such element and extending from the major surface of such element toward a second surface of such element remote from the major surface of such element.

10. The method of claim 9, wherein a through silicon via extends through the microelectronic and second elements and is electrically connected with a bond pad of the microelectronic element and a bond pad of the second element.

11. The method of claim 1, wherein at least one of the steps of forming includes depositing a reflow metal, and the step of joining includes heating the reflow metal to a temperature that causes the reflow metal to melt.

12. The method of claim 1, wherein the steps of forming include depositing copper, and the step of joining includes applying heat and pressure between the elements such that the copper overlying the microelectronic element and the copper overlying the second element fuse together.

13. The method of claim 12, further comprising forming a layer of gold on the copper overlying at least one of the elements, and the step of joining includes heating the gold to a temperature at which the gold diffuses into the copper.

14. The method of claim 1, wherein the step of forming the first and second metal layers includes depositing a base metal and a layer of gold overlying the base metal, wherein the step of joining includes applying heat and pressure to the elements until the first and second metal layers fuse together.

15. A microelectronic assembly comprising:
a microelectronic element having a major surface, and a compliant layer and at least one bond pad exposed at the major surface, the microelectronic element containing a plurality of active circuit elements;
a second element having a coefficient of thermal expansion of less than 10 ppm/° C., the second element having a major surface and a compliant layer exposed at the major surface thereof;
a first metal layer overlying the at least one bond pad and the compliant layer of the microelectronic element, wherein a gap is formed in the first metal layer between the at least one bond pad and the compliant layer;
a second metal layer overlying the compliant layer of the second element; and
wherein first portions of the first and second metal layers overlying the compliant layers are joined together so as to mechanically and electrically connect the microelectronic element with the second element.

16. The assembly of claim 15, wherein the second element has at least one bond pad exposed at the major surface thereof, the second metal layer overlies the at least one bond pad, wherein second portions of the first and second metal layers overlying the at least one bond pads and being separate from the first portions are joined together.

17. The assembly of claim 15, wherein the gap is large enough to provide a relief volume sufficient to compensate for a sum of the total variation in co-planarity of the top surfaces of the first metal layer overlying the at least one bond pad and the compliant layer on the microelectronic element.

18. The assembly of claim 15, wherein the height of the at least one bond pad above the major surface of the microelectronic element differs from the height of the compliant layer above the major surface of the microelectronic element.

19. A microelectronic assembly comprising:
a microelectronic element having a major surface and a compliant layer exposed at the major surface; and
a second element having a major surface and a compliant layer exposed at the major surface of the second element;
the major surfaces of the microelectronic and second elements confronting one another with a plurality of metal elements disposed between the compliant layers, the metal elements being electrically isolated from the microelectronic element,
wherein the metal elements join the microelectronic and second elements with one another,
wherein on each of the microelectronic element and the second element, a gap is formed along the major surface between one or more of the metal elements and an adjacent portion of the compliant layer,
wherein the gap is large enough to provide a relief volume into which a reflowable metal can flow from between the compliant layers of the microelectronic and second elements, the relief volume being sufficient to compensate for a sum of the total variation in co-planarity of top surfaces of the metal elements and the compliant layer overlying the major surface of the microelectronic element, and the total variation in co-planarity of top surfaces of the metal elements and the compliant layer overlying the major surface of the second element.

20. The assembly of claim 19, wherein the microelectronic element is a chip, and the second element has an area substantially the same as an area of the chip.

* * * * *